US008203162B2

(12) United States Patent
Jang et al.

(10) Patent No.: US 8,203,162 B2
(45) Date of Patent: Jun. 19, 2012

(54) LIGHT EMITTING DEVICE HAVING VERTICAL STRUCTRUE AND METHOD FOR MANUFACTURING THE SAME

(75) Inventors: Jun Ho Jang, Anyang-si (KR); Hyun Jae Lee, Yongin-si (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 102 days.

(21) Appl. No.: 12/656,612

(22) Filed: Feb. 4, 2010
(Under 37 CFR 1.47)

(65) Prior Publication Data
US 2010/0163908 A1 Jul. 1, 2010

Related U.S. Application Data

(63) Continuation of application No. 11/702,679, filed on Feb. 6, 2007, now Pat. No. 7,696,523.

(30) Foreign Application Priority Data

Mar. 14, 2006 (KR) .................. 10-2006-0023538
Mar. 14, 2006 (KR) .................. 10-2006-0023539
Mar. 16, 2006 (KR) .................. 10-2006-0024152

(51) Int. Cl.
*H01L 33/00* (2010.01)

(52) U.S. Cl. .............. 257/98; 257/79; 257/99; 257/676; 257/E33.001

(58) Field of Classification Search .............. 257/79, 257/98, 99, 676
See application file for complete search history.

(56) References Cited

U.S. PATENT DOCUMENTS

| 6,762,069 | B2 | 7/2004 | Huang et al. |
| 6,797,987 | B2 | 9/2004 | Chen |
| 7,511,311 | B2 * | 3/2009 | Kususe et al. .................. 257/95 |
| 2003/0015721 | A1 * | 1/2003 | Slater et al. ..................... 257/99 |
| 2005/0040425 | A1 | 2/2005 | Akita |
| 2005/0194690 | A1 | 9/2005 | Ishii et al. |
| 2005/0242365 | A1 | 11/2005 | Yoo |
| 2006/0043387 | A1 * | 3/2006 | Hata .............................. 257/79 |

(Continued)

FOREIGN PATENT DOCUMENTS

JP 11-145514 5/1999
(Continued)

OTHER PUBLICATIONS

"1-3μm InGaAsP Ridge Waveguide Laser on GaAs and Silicon Substrates by Thin-Film Transfer", Electronics Letters, vol. 27, No. 10, pp. 850-851.
Lee, Chin C. et al., "A New Bonding Technology Using Gold and Tin Multilayer Composite Structures", IEEE Transactions on Components, Hybrids and Manufacturing Technology, vol. 14, No. 2, Jun. 1991, pp. 407-412.

(Continued)

*Primary Examiner* — Wai Sing Louie
(74) *Attorney, Agent, or Firm* — McKenna Long & Aldridge LLP

(57) ABSTRACT

A light emitting device having a vertical structure and a method for manufacturing the same, which are capable of damping impact generated during a substrate separation process and achieving an improvement in mass productivity, are disclosed. The light emitting device includes a semiconductor layer having a multilayer structure, a first electrode arranged at one surface of the semiconductor layer, a metal support arranged on the first electrode, and an impact damping layer arranged between the first electrode and the metal support, and made of a metal having a ductility higher than a ductility of a metal for the metal support.

24 Claims, 12 Drawing Sheets

U.S. PATENT DOCUMENTS

2006/0157721 A1 * 7/2006 Tran et al. .................. 257/98

FOREIGN PATENT DOCUMENTS

| | | |
|---|---|---|
| JP | 11-243228 | 9/1999 |
| JP | 11-284224 | 10/1999 |
| JP | 2004-363532 | 12/2004 |
| JP | 2005-012188 | 1/2005 |
| KR | 10-2001-0023092 | 3/2001 |
| KR | 10-2004-0073434 A | 8/2004 |
| KR | 2005-0012729 | 2/2005 |
| KR | 2005-0082040 | 8/2005 |
| KR | 2005-0089120 | 9/2005 |
| KR | 10-2007-0013291 A | 1/2007 |
| WO | WO 2005/104780 A2 | 11/2005 |

OTHER PUBLICATIONS

W. Pittroff et al., "Mounting of High Power Laser Diodes on Boron Nitride Heat Sinks using an Optimized Au/Sn Metallurgy", 2000 Electronic Components and Technology Conference, pp. 119-124.

Gessmann, Th. et al., "High-efficiency AlGaInP light-emitting diodes for solid-state lighting applications", Applied Physics Reviews-Focused Review, Journal of Applied Physics, vol. 95, No. 5, Mar. 1, 2004, pp. 2203-2216.

Morita et al. "Watt-Class High-Output-Power 365 nm Ultraviolet Light-Emitting Diodes", Japanese Journal of Applied Physics, vol. 43, No. 9A, pp. 5945-5950, 2004.

* cited by examiner

LIGHT EMITTING DEVICE HAVING VERTICAL STRUCTRUE AND METHOD FOR MANUFACTURING THE SAME

This application is a continuation of prior U.S. patent application Ser. No. 11/702,679 filed Feb. 6, 2007, now U.S. Pat. No. 7,696,523 which claims priority to Korean Patent Application Nos. 10-2006-0023539, filed Mar. 14, 2006; 10-2006-0023538, filed Mar. 14, 2006; 10-2006-0024152, filed Mar. 16, 2006, each of which is incorporated herein by reference in its entirety This application claims the benefit of Korean Patent Application No. 10-2006-0023538, filed on Mar. 14, 2006, Korean Patent Application No. 10-2006-0023539, filed on Mar. 14, 2006, and Korean Patent Application No. 10-2006-0024152, filed on Mar. 16, 2006, which are hereby incorporated by references as if fully set forth herein.

BACKGROUND OF THE INVENTION

1. Field of the Invention

The present invention relates to a light emitting device having a vertical structure and a method for manufacturing the same, and more particularly, to a light emitting device having a vertical structure and a method for manufacturing the same which are capable of damping impact generated in a substrate separation process, and achieving an improvement in mass productivity.

2. Discussion of the Related Art

Light emitting diodes (LEDs) are well known as a semiconductor light emitting device which converts current to light, to emit light. Since a red LED using GaAsP compound semiconductor was commercially available in 1962, it has been used, together with a GaP:N-based green LED, as a light source in electronic apparatuses, for image display.

The wavelength of light emitted from such an LED depends on the semiconductor material used to fabricate the LED. This is because the wavelength of the emitted light depends on the band gap of the semiconductor material representing energy difference between valence-band electrons and conduction-band electrons.

Gallium nitride (GaN) compound semiconductor has been highlighted. One of the reasons why GaN compound semiconductor has been highlighted is that it is possible to fabricate a semiconductor layer capable of emitting green, blue, or white light, using GaN in combination with other elements, for example, indium (In), aluminum (Al), etc.

Thus, it is possible to adjust the wavelength of light to be emitted, using GaN in combination with other appropriate elements. Accordingly, where GaN is used, it is possible to appropriately determine the materials of a desired LED in accordance with the characteristics of the apparatus to which the LED is applied. For example, it is possible to fabricate a blue LED useful for optical recording or a white LED to replace a glow lamp.

On the other hand, initially-developed green LEDs were fabricated using GaP. Since GaP is an indirect transition material causing a degradation in efficiency, the green LEDs fabricated using this material cannot practically produce light of pure green. By virtue of the recent success growth of an InGaN thin film, however, it has been possible to fabricate a high-luminescent green LED.

By virtue of the above-mentioned advantages and other advantages of GaN-based LEDs, the GaN-based LED market has rapidly grown. Also, techniques associated with GaN-based electro-optic devices have rapidly developed since the GaN-based LEDs became commercially available in 1994.

GaN-based LEDs have been developed to exhibit light emission efficiency superior over that of glow lamps. Currently, the efficiency of GaN-based LEDs is substantially equal to that of fluorescent lamps. Thus, it is expected that the GaN-based LED market will grow significantly.

Despite the rapid advancement in technologies of GaN-based semiconductor devices, the fabrication of GaN-based devices suffers from a great disadvantage of high-production costs. This disadvantage is closely related to difficulties associated with growing of a GaN thin film (epitaxial layer) and subsequent cutting of finished GaN-based devices.

Such a GaN-based device is generally fabricated on a sapphire ($Al_2O_3$) substrate. This is because a sapphire wafer is commercially available in a size suited for the mass production of GaN-based devices, supports GaN epitaxial growth with a relatively high quality, and exhibits a high processability in a wide range of temperatures.

Further, sapphire is chemically and thermally stable, and has a high-melting point enabling implementation of a high-temperature manufacturing process. Also, sapphire has a high bonding energy (122.4 Kcal/mole) and a high dielectric constant. In terms of a chemical structure, the sapphire is a crystalline aluminum oxide ($Al_2O_3$).

Meanwhile, since sapphire is an insulating material, available LED devices manufactured using a sapphire substrate (or other insulating substrates) are practically limited to a lateral or vertical structure.

In the lateral structure, all metal contacts for use in injection of electric current into LEDs are positioned on the top surface of the device structure (or on the same substrate surface). On the other hand, in the vertical structure, one metal contact is positioned on the top surface, and the other contact is positioned on the bottom surface of the device structure after removal of the sapphire (insulating) substrate.

In addition, a flip chip bonding method has also been widely employed. In accordance with the flip chip bonding method, an LED chip, which has been separately prepared, is attached to a sub-mount of, for example, a silicon wafer or ceramic substrate having an excellent thermal conductivity, under the condition in which the LED chip is inverted.

However, the lateral structure or the flip chip method suffers from the problems associated with poor heat release efficiency because the sapphire substrate has a heat conductivity of about 27 W/mK, thus leading to a very high heat resistance. Furthermore, the flip chip method has also disadvantages of requiring large numbers of photolithography process steps, thus resulting in complicated manufacturing processes.

To this end, LED devices having a vertical structure have been highlighted in that the vertical structure involves removal of the sapphire substrate.

In the fabrication of such a vertical LED structure, a laser lift off (LLO) method is used to remove the sapphire substrate, and thus, to solve the problems caused by the sapphire substrate.

However, it is impossible to completely remove the sapphire substrate at once, using the LLO method, due to the size and limited uniformity of a laser beam used in the LLO method. For this reason, uniform small-size laser beams are irradiated to respective portions of the sapphire substrate, in order to the entire portion of the sapphire substrate.

In the LLO method, stress is applied to the GaN thin film upon incidence of a laser beam. In order to separate a sapphire substrate 1 and a GaN thin film 2 from each other, as shown in FIG. 1, it is necessary to use a laser beam having a high energy density. The laser beam resolves GaN into a metal element, namely, Ga, and nitrogen gas ($N_2$).

The resolved nitrogen gas exhibits a high expansion force, so that it applies considerable impact not only to the GaN thin film 2, but also to a support layer for the GaN thin film 2 and metal layers required for the fabrication of the device. As a result, a degradation in bondability occurs primarily. In addition, a degradation in electrical characteristics occurs.

Such results can be observed from FIG. 2. As shown in FIG. 2, wave patterns exhibited as having irregularities may be formed at the peripheral portion of the GaN thin film after completion of the LLO process. Also, during the LLO process, many poor bonding portions may be observed on the thin film.

Furthermore, the above-mentioned method incurs damage of a back surface of the GaN thin film, on which an LED is to be formed, in a region where laser beams overlap with each other. There may also be a phenomenon that cracks formed at poor-quality portions of the GaN thin film are propagated to other portions of the GaN thin film.

In order to prevent such a phenomenon, various methods have been used. For example, in one method, the GaN thin film is etched in certain regions, to separate respective devices from one another, as shown in FIG. 3. Thereafter, a semiconductor wafer 5 made of Si, GaAs, etc. is bonded to the GaN thin film. In another method, a metal support 7 is formed on the GaN thin film in accordance with a plating method using a metal such as Cu, Au, or Ni, and the sapphire substrate 1 is then separated, as shown in FIG. 4.

In detail, in the case of FIG. 3, the bonding of the semiconductor wafer 5, which has a thermal expansion coefficient considerably different from that of a GaN material, is achieved by a bonding material 4 bonded to an electrode layer 3. For this reason, the wafer 5 may be greatly bent after the bonding process. In addition, a plurality of empty spaces causing formation of poor bonding interfaces may be formed.

In the above case, air may remain in the empty space of a trench defined between adjacent devices after the bonding process. This air is expanded by high thermal energy of a laser, thereby causing cracks to be formed at the GaN thin film 2 in a region around the trench.

On the other hand, in the case of FIG. 4, in which a support substrate is fabricated using a metal support 7 formed by plating of a metal such as Cu, Au, or Ni, there are advantages of a high thermal stability and reduced bending of the metal support 7 after the plating process, as compared to the semiconductor wafer bonding method.

In the case using the plating process, however, the bondability between laminated layers, for example, the GaN thin film 2, electrode layer 3, and coupling metal layer 6, may be degraded due to stress caused by the laser.

Furthermore, there are adverse affects on the electrical characteristics of the metal layers 3 and 6 used for the fabrication of the GaN-based devices. In addition, there is a degradation in electrical characteristics associated with the electrical electrode material of the GaN thin film 2, namely, ohmic metal.

Due to the above-mentioned reasons, it is necessary to minimize irradiation of laser beams in the substrate separation process using the laser beams, and impact caused by expansion of nitrogen gas generated during the laser beam irradiation.

Meanwhile, in the above-mentioned vertical LED structure, a trench etching is carried out after formation of the GaN thin film 2 on the sapphire substrate 1, namely, formation of a GaN LED structure, in order to trenches 8 for defining regions corresponding to respective devices.

The trench etching is continued until the sapphire substrate 1 is exposed. This trench etching is a prolonged process in that the etching depth thereof reaches about 5 to 10 μm.

SUMMARY OF THE INVENTION

Accordingly, the present invention is directed to a light emitting device having a vertical structure and a method for manufacturing the same that substantially obviate one or more problems due to limitations and disadvantages of the related art.

An object of the present invention is to provide a light emitting device having a vertical structure and a method for manufacturing the same which are capable of damping impact generated during a substrate separation process using a laser lift off method, and thus, preventing damage of a semiconductor layer, maintaining the ohmic characteristics of electrodes, reducing the etching time for separation of chip regions, and achieving an easy chip separation.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device having a vertical structure comprises: a semiconductor layer having a multilayer structure; a first electrode arranged at one surface of the semiconductor layer; a metal support arranged on the first electrode; and an impact damping layer arranged between the first electrode and the metal support, and made of a metal having a ductility higher than a ductility of a metal of the metal support.

In another aspect of the present invention, a light emitting device having a vertical structure comprises: a semiconductor layer having a multilayer structure; a first electrode arranged at one surface of the semiconductor layer; a second electrode arranged at the other surface of the semiconductor layer; a passivation layer arranged at a side surface of the semiconductor layer; a metal support arranged on the first electrode; and a metal layer arranged between the first electrode and the metal support, and made of a metal having a ductility higher than a ductility of a metal of the metal support.

In still another aspect of the present invention, a method for manufacturing a light emitting device having a vertical structure comprises: growing a semiconductor layer having a multilayer structure over an insulating substrate; etching the semiconductor layer, to define unit device regions; forming electrodes on the semiconductor layer; forming a metal support on the electrodes; irradiating a laser to the unit device regions of the semiconductor layer, to form grooves in the semiconductor layer; removing the insulating substrate; and forming metal pads on a surface of the semiconductor layer, from which the insulating substrate has been removed, in the unit device regions, respectively.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 5 to 11 are sectional views illustrating a first embodiment of the present invention, in which:

FIG. 5 is a sectional view illustrating a process for forming a semiconductor layer having a multilayer structure over a substrate;

FIG. 6 is a sectional view illustrating a process for etching the semiconductor layer;

FIG. 7 is a sectional view illustrating a process for forming electrodes and a passivation layer on the semiconductor layer;

FIG. 8 is a sectional view illustrating a process for forming a seed metal layer and a metal support;

FIG. 9 is a sectional view illustrating a process for irradiating a laser at the side of the substrate;

FIG. 10 is a sectional view illustrating a laser lift off (LLO) process; and

FIG. 11 is a sectional view illustrating a process for separating the substrate, and forming electrodes;

FIGS. 12 to 18 are sectional views illustrating a second embodiment of the present invention, in which:

FIG. 12 is a sectional view illustrating a process for forming a semiconductor layer having a multilayer structure over a substrate;

FIG. 13 is a sectional view illustrating a process for etching the semiconductor layer;

FIG. 14 is a sectional view illustrating a process for forming electrodes and a passivation layer on the semiconductor layer;

FIG. 15 is a sectional view illustrating a process for forming a seed metal layer and a metal support;

FIG. 16 is a sectional view illustrating a process for irradiating a laser at the side of the metal support;

FIG. 17 is a sectional view illustrating an LLO process; and

FIG. 18 is a sectional view illustrating a process for separating the substrate, and forming electrodes;

DETAILED DESCRIPTION OF THE INVENTION

Figure 1:
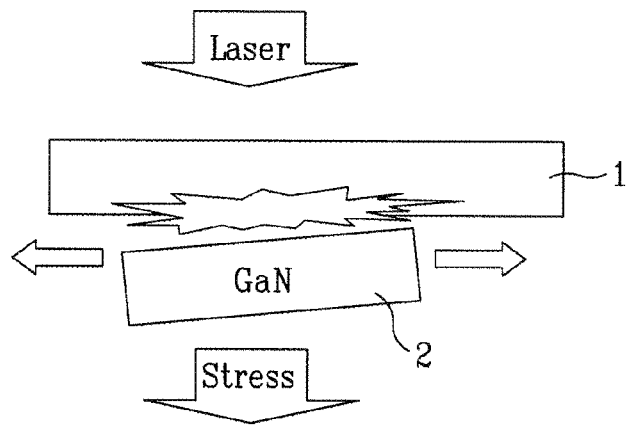
FIG. 1 is a schematic view illustrating separation of a substrate from a conventional light emitting device structure.
Figure 2:
FIG. 2 is a photograph illustrating a surface of the conventional light emitting device structure from which the substrate has been separated.
Figure 3:
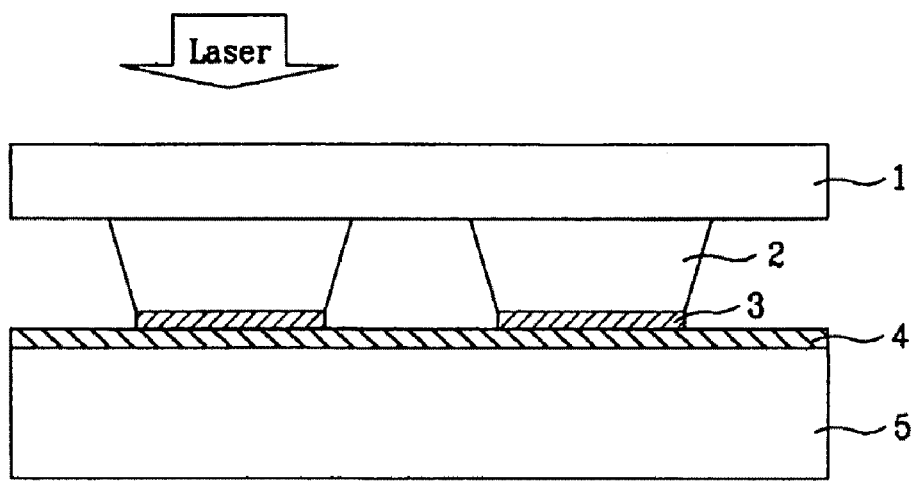
FIG. 3 is a sectional view illustrating separation of a light emitting device structure in accordance with a conventional method using bonding of a semiconductor wafer.
Figure 4:
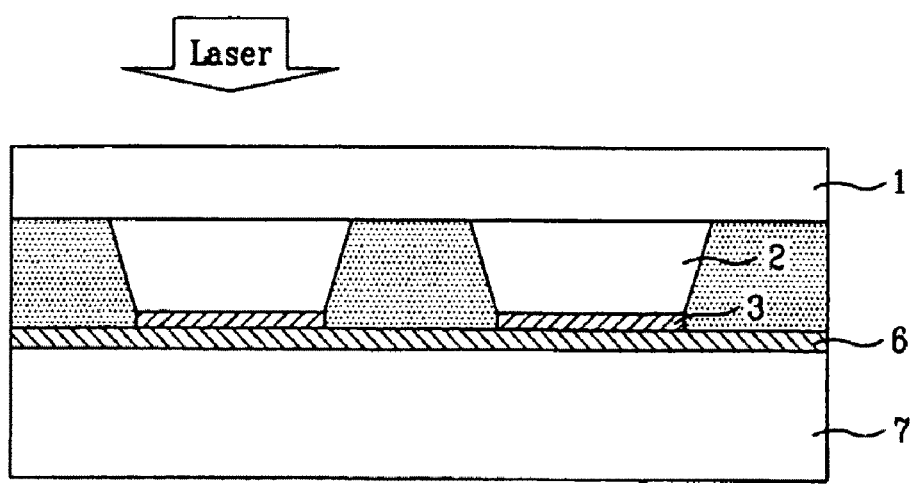
FIG. 4 is a sectional view illustrating separation of a light emitting device structure in accordance with a conventional method using bonding of a metal support plate.

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like numbers refer to like elements throughout the description of the figures. In the drawings, the thickness of layers and regions are exaggerated for clarity.

It will be understood that when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

<First Embodiment>

Hereinafter, a first embodiment of the present invention will be described with reference to FIGS. 5 to 11.

Figure 5:
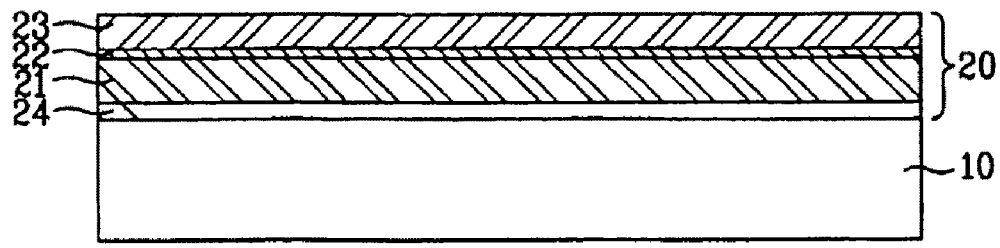
Figure 6:
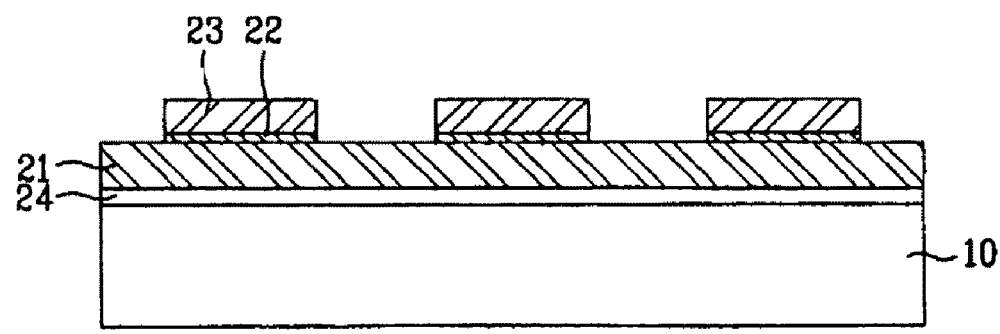

As shown in FIG. 5, in order to manufacture a light emitting device according to this embodiment, a process for growing a GaN semiconductor layer 20 having a multilayer structure over a sapphire substrate 10 is first carried out.

The GaN semiconductor layer 20 includes an n type GaN layer 21 formed over the substrate 10, an active layer 22 formed over the n type GaN layer 21, and a p type GaN layer 23 formed over the active layer 22. A separate buffer layer 24 may be formed between the n type GaN layer 21 and the substrate 10.

The active layer 22 may have a GaN-based single quantum well (SQW) structure, a GaN-based multi-quantum well (MQW) structure, or a quantum structure, for example, a supper lattice of the GaN-based SQW or MQW structure.

The quantum structure of the active layer 22 may be formed using a combination of various GaN-based materials. For example, AlInGaN, InGaN, etc. may be used.

The semiconductor layer 20 formed over the substrate 10, as described above, may be mesa etched, as shown in FIG. 6, in order to divide unit device regions from one another.

The mesa etching may be carried out such that the n type GaN layer 21 of the semiconductor layer 20 is exposed, different from a trench etching which will be carried out such that the substrate 10 is exposed. Thus, the mesa etching can be achieved within a time shorter than that of a general trench etching process.

Figure 7:
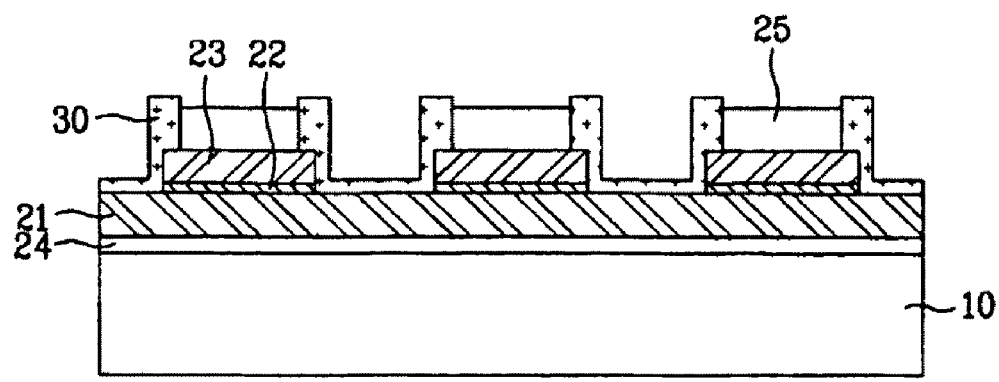

Thereafter, p type electrodes 25 are formed on the GaN semiconductor layer 20, as shown in FIG. 7.

Each p type electrode 25 may include an ohmic electrode and a reflection electrode. For the ohmic electrode, a transparent electrode is used. In this case, the transparent electrode may be made of an appropriate material such as ruthenium/gold (Ru/Au), nickel/gold (Ni/Au), or indium tin oxide (ITO).

The reflection electrode functions to reflect light emitted from the semiconductor layer 20, in order to effectively diffuse the light. The reflection electrode is made of silver (Ag) or aluminum (Al), together with a material exhibiting a high reflectivity.

In the case in which mesa etching is carried out, as described above, a passivation layer 30 may be formed on the portions of the semiconductor layer 20 exposed in accordance with the etching, using an insulating material.

Figure 8:
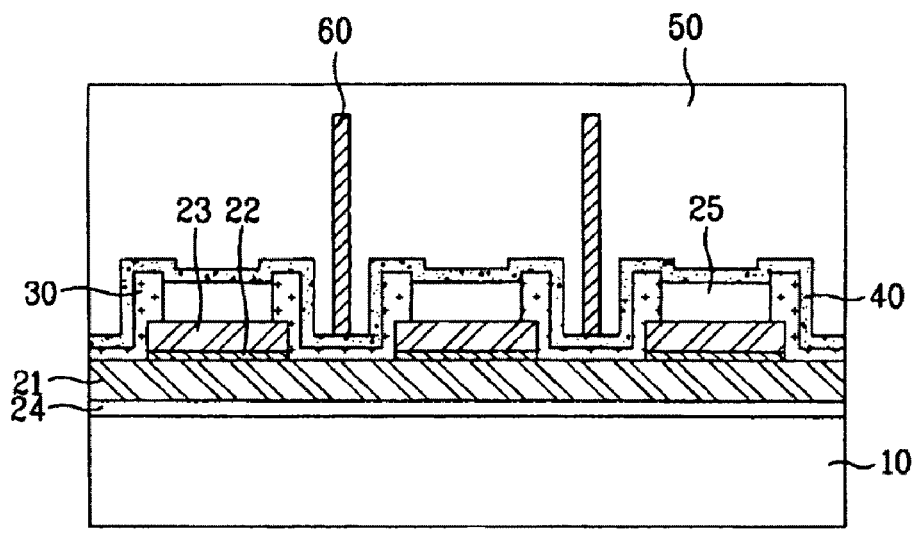

A metal support 50 is then laminated over the p type electrodes 25, as shown in FIG. 8. In order to enable the metal support 50 to be effectively bonded to the p type electrodes 25, the formation of the metal support 50 may be carried out after lamination of a seed metal layer 40.

The metal support 50 may be formed in accordance with electro-plating of one of copper (Cu), gold (Au), nickel (Ni), and an alloy thereof.

It is preferred that the thickness of the metal support 50 be 30 to 200 μm.

The seed metal layer 40 may be made of one of titanium (Ti), platinum (Pt), gold (Au), nickel (Ni), aluminum (Al), and an alloy thereof.

A diffusion barrier wall (not shown) may be formed between the ohmic electrode and the reflection electrode and between the reflection electrode and the seed metal layer 40, in order to prevent the metal of the metal support 50 from being transferred to an under layer.

In order to provide a convenience upon separating the semiconductor layer 20 into portions respectively corresponding to unit devices, the formation of the metal support 50 may be carried out after formation of posts 60 at respective mesa-etched portions of the semiconductor layer 20.

Preferably, the posts are made of photoresist. The metal support 50 may be formed to have a small thickness such that the posts 60 are exposed, for a subsequent device separation.

Figure 9:
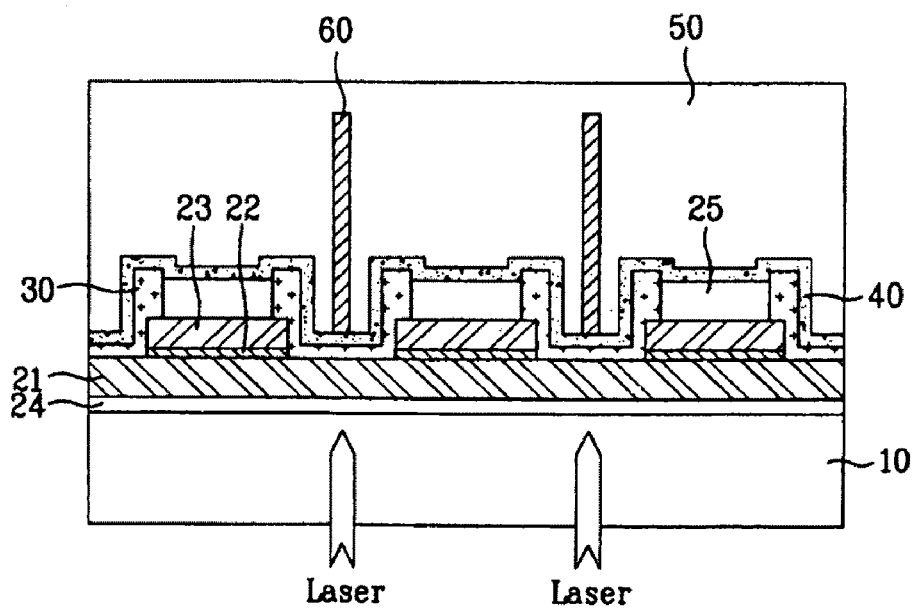

In this structure, a laser is irradiated to the mesa-etched portions of the semiconductor layer 20 at the side of the substrate 10, as shown in FIG. 9. The laser passes through the substrate 10, reaches the lower surface of the semiconductor layer 20, and then scribes grooves 11 in the lower surface of the semiconductor layer 20 (laser scribing).

Figure 10:
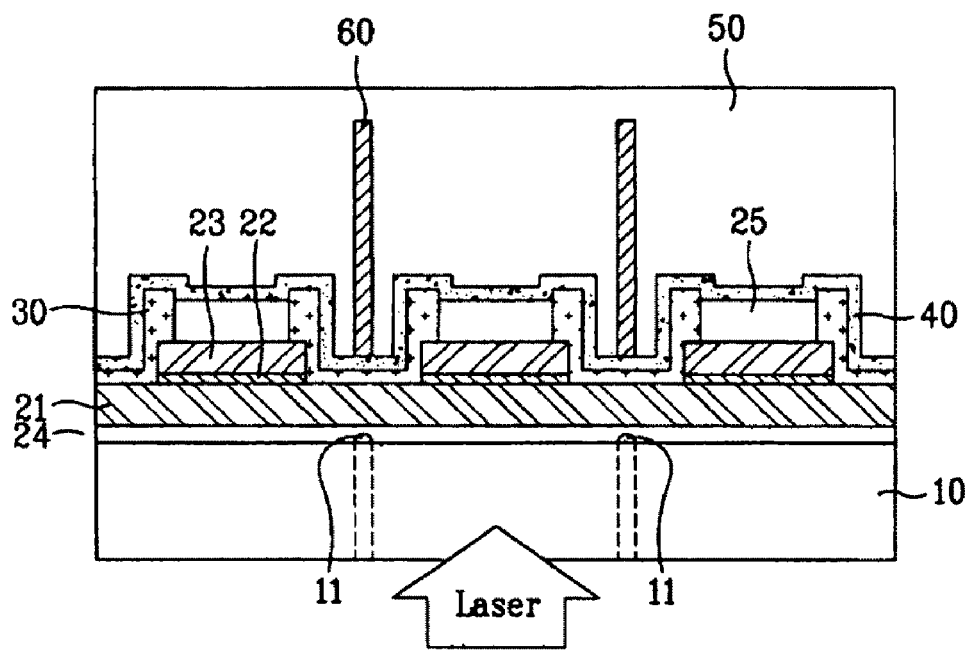

As shown in FIG. 10, the grooves 11 are formed to reach the buffer layer or n type GaN layer of the semiconductor layer 20. The grooves 11 function to release thermal stress or nitrogen gas ($N_2$) during a subsequent laser lift off (LLO) process.

Of course, the grooves 11 may also be formed to reach a level corresponding to the lower ends of the posts or to extend through the metal support 50.

For the laser used to form the grooves 11, various lasers may be used. It is preferred that a diode pumped solid state (DPSS) laser be used. Light having a wavelength of 266 nm may be used. Also, light having other wavelengths and intensities may be used.

The DPSS laser has many advantages of high power, high efficiency, long life span, high reliability, lightness, etc., as compared to the existing high-power lasers, for example, a $CO_2$ laser, an Nd:YAG laser pumped by a flash lamp, and an excimer laser.

In the case of the laser pumped by the flash lamp, the flash lamp exhibits a light emission efficiency of more than 60%. However, the spectrum of light emitted from the flash lamp has a wide wavelength band ranging from an ultraviolet ray range to an infrared ray range, so that its matchability with the absorption spectrum of a solid state laser medium is low. For this reason, a laser efficiency of only several percentages is obtained.

On the other hand, in the case of the DPSS laser, its pumping is achieved by, for example, a GaAlAs-based laser diode of a several ten watt grade. In this case, the laser is well matched with the absorption spectrum of a solid state laser medium using $Nd_3^+$ as an active ion. Accordingly, a laser efficiency of more than 30% is obtained.

After the formation of the grooves 11 as described above, separation of the substrate 10 is carried out using a general LLO process.

That is, an excimer laser is irradiated to the semiconductor layer 20 at the side of the substrate 10. The laser beam passes through the substrate 10, and locally generates heat at the substrate (sapphire substrate) 10 and buffer layer 24. The generated heat resolves GaN into Ga and $N_2$ gas at the interface between the sapphire substrate 10 and the GaN buffer layer 24. As a result, the sapphire substrate 10 is separated from the semiconductor layer 20.

At this time, the local heat may be released through the grooves 11 while resolving GaN into Ga and $N_2$ gas. Also, the $N_2$ gas is also released through the grooves 11 without damaging the semiconductor layer 20.

Figure 11:
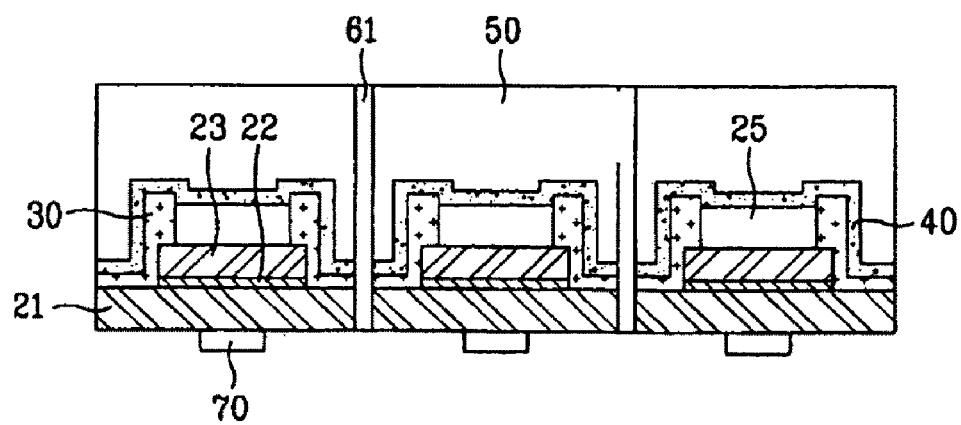

After the removal of the substrate 10 using the LLO process as described above, a plurality of n type electrodes 70 are formed on a surface, from which the substrate 10 has been removed, in regions corresponding to respective devices, as shown in FIG. 11.

Each n type electrode 70 may have the form of a metal pad, as shown in FIG. 11.

LED devices are completely formed in accordance with the formation of the n type electrodes 70 as described above. Thereafter, a process for separating the LED devices into individual unit devices is carried out.

Where the posts 60 have been formed, they are removed. In this case, gaps 61 are formed in regions from which the posts 60 are removed, respectively. Accordingly, it is possible to achieve the device separation using the gaps 61.

In this case, it is preferred that the metal support 50 be formed to have a small thickness such that the posts 60 are exposed through the metal support 50.

For example, the metal support 50 may have a small thickness of about 70 μm.

The separation of individual devices may be achieved using an expansion tape.

<Second Embodiment>

Hereinafter, a second embodiment of the present invention will be described with reference to FIGS. 12 to 18. In the following description, no explanation will be given of the same process as that of the first embodiment.

Figure 12:
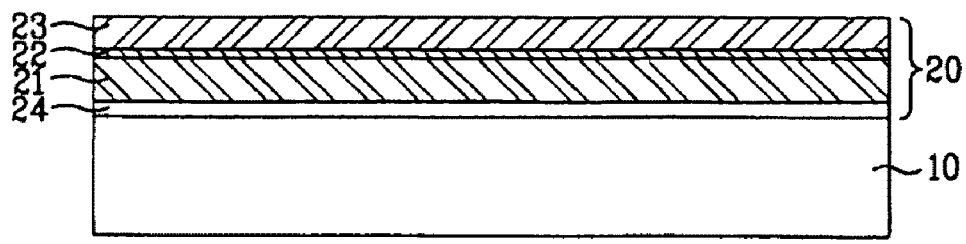
Figure 13:
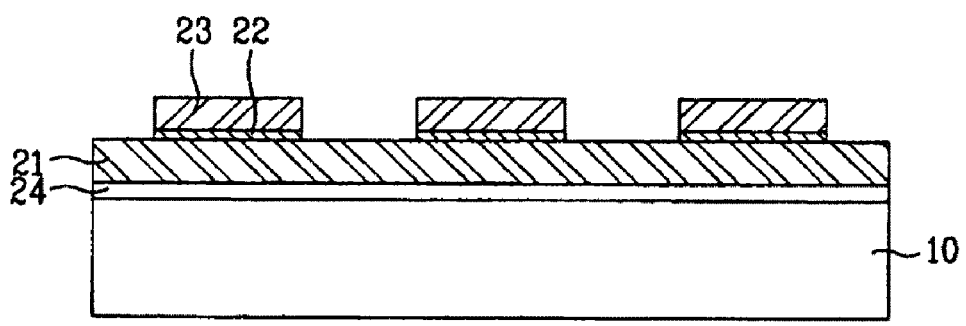

As shown in FIG. 12, in order to manufacture a light emitting device according to this embodiment, a process for growing a GaN semiconductor layer 20 having a multilayer structure over a sapphire substrate 10 is first carried out.

The GaN semiconductor layer 20 includes an n type GaN layer 21 formed over the substrate 10, an active layer 22 formed over the n type GaN layer 21, and a p type GaN layer 23 formed over the active layer 22. A separate buffer layer 24 may be formed between the n type GaN layer 21 and the substrate 10.

The active layer 22 may have a GaN-based single quantum well (SQW) structure, a GaN-based multi-quantum well (MQW) structure, or a quantum structure, for example, a supper lattice of the GaN-based SQW or MQW structure.

The quantum structure of the active layer 22 may be formed using a combination of various GaN-based materials. For example, AlInGaN, InGaN, etc. may be used.

The semiconductor layer 20 formed over the substrate 10, as described above, may be mesa etched, as shown in FIG. 13, in order to divide unit device regions from one another.

The mesa etching may be carried out such that the n type GaN layer 21 of the semiconductor layer 20 is exposed, different from a trench etching which will be carried out such that the substrate 10 is exposed. Thus, the mesa etching can be achieved within a time shorter than that of a general trench etching process.

Figure 14:
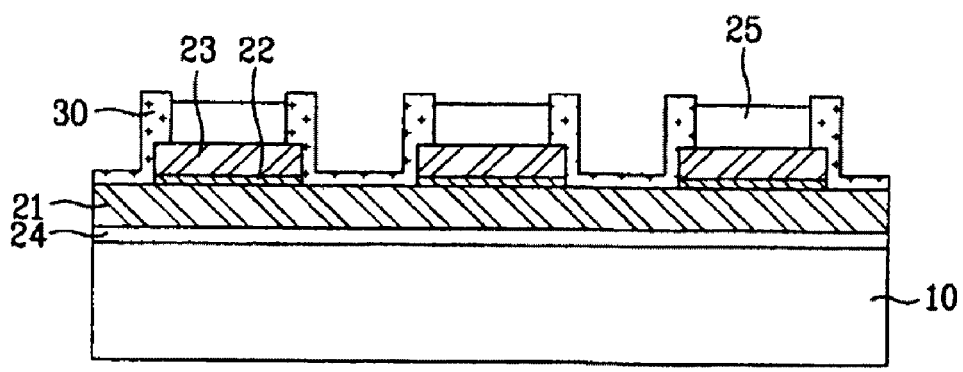

Thereafter, p type electrodes 25 are formed on the GaN semiconductor layer 20, as shown in FIG. 14.

Each p type electrode 25 may include an ohmic electrode and a reflection electrode. For the ohmic electrode, a transparent electrode is used. In this case, the transparent electrode may be made of an appropriate material such as ruthenium/gold (Ru/Au), nickel/gold (Ni/Au), or indium tin oxide (ITO).

The reflection electrode functions to reflect light emitted from the semiconductor layer 20, in order to effectively diffuse the light. The reflection electrode is made of silver (Ag) or aluminum (Al), together with a material exhibiting a high reflectivity.

After the formation of the p type electrodes 25 as described above, a passivation layer 30 may be formed on the portions of the semiconductor layer 20 exposed in accordance with the etching, using an insulating material.

Figure 15:
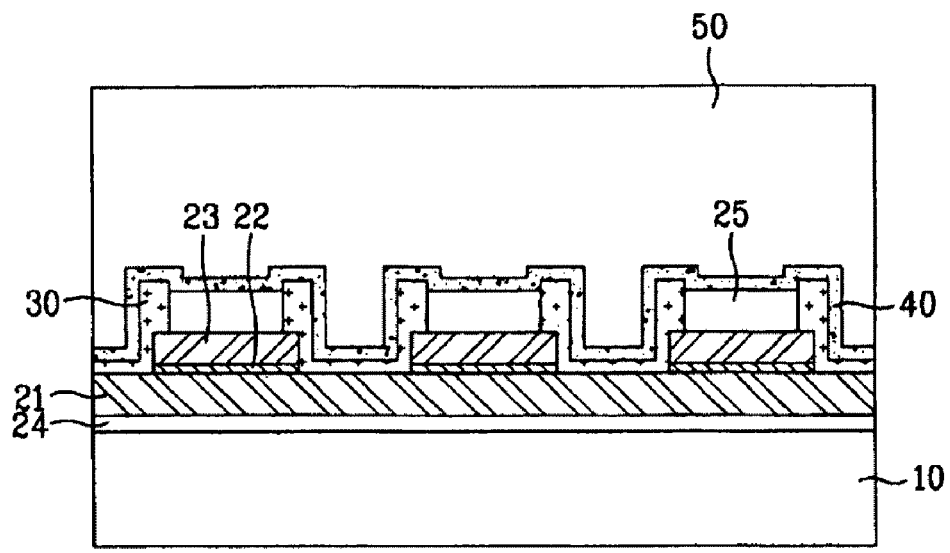

A metal support 50 is then laminated over the p type electrode 25, as shown in FIG. 15. In order to enable the metal support 50 to be effectively bonded to the p type electrode 25, the formation of the metal support 50 may be carried out after lamination of a seed metal layer 40.

The metal support 50 may be formed in accordance with electro-plating of one of copper (Cu), gold (Au), nickel (Ni), and an alloy thereof.

It is preferred that the thickness of the metal support 50 be 30 to 200 μm.

The seed metal layer 40 may be made of one of titanium (Ti), platinum (Pt), gold (Au), nickel (Ni), aluminum (Al), and an alloy thereof.

A diffusion barrier wall (not shown) may be formed between the ohmic electrode and the reflection electrode and between the reflection electrode and the seed metal layer 40, in order to prevent the metal of the metal support 50 from being transferred to an under layer.

Figure 16:
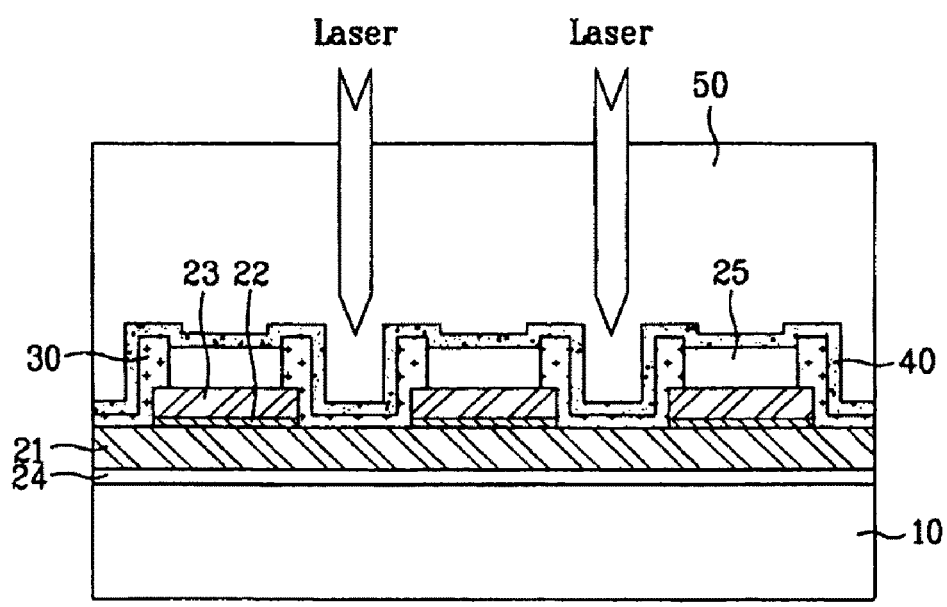

In this structure, a laser is irradiated to the mesa-etched portions of the semiconductor layer 20 at the side of the metal support 50, as shown in FIG. 16. The laser sequentially passes through the metal support 50, seed metal layer 40, passivation layer 30, and semiconductor layer 20, in this order, and then reaches the substrate 10, while scribing grooves 11 (laser scribing).

During the scribing of the grooves 11, the metal support 50 and seed metal layer 40 may flow downwardly between adjacent portions of the semiconductor layer 20 while being melted, or may be re-joined just after the irradiation of the laser. The passivation layer 30 can avoid occurrence of such a phenomenon.

Figure 17:
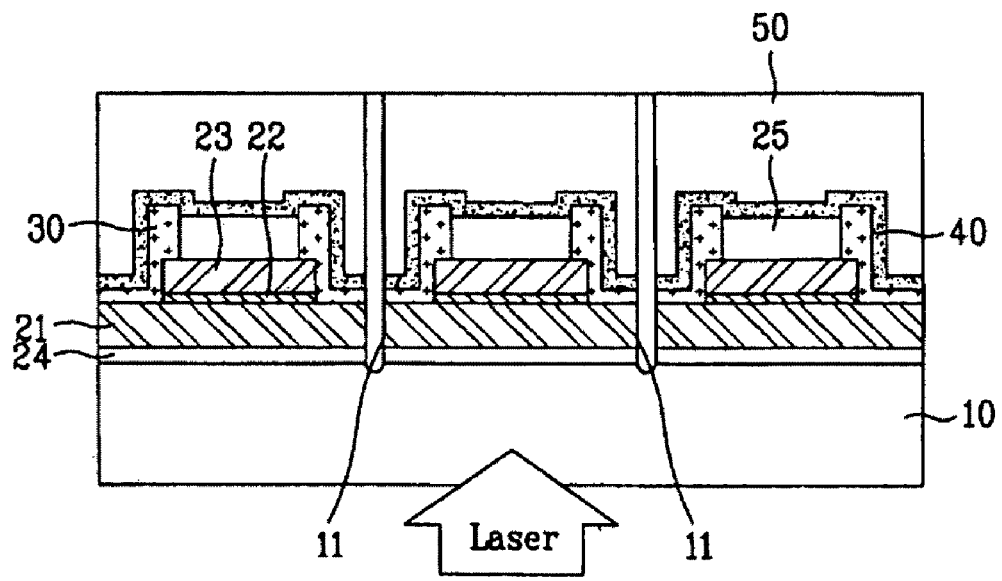

That is, the grooves 11 are formed to extend to the upper surface of the substrate 10, as shown in FIG. 17. In particular, the grooves 11 function to release thermal stress or nitrogen gas ($N_2$) through groove portions formed at the substrate 10, during a subsequent laser lift off (LLO) process.

Of course, the grooves 11 may also be formed to extend through the substrate 10.

For the laser used to form the grooves 11, a diode pumped solid state (DPSS) laser is preferred, as in the first embodiment. Light having a wavelength of 266 nm may be used. Also, light having other wavelengths and intensities may be used.

After the formation of the grooves 11 as described above, separation of the substrate 10 is carried out using a general LLO process.

That is, an excimer laser is irradiated to the semiconductor layer 20 at the side of the substrate 10. The laser beam passes through the substrate 10, and locally generates heat at the substrate (sapphire substrate) 10 and buffer layer 24. The generated heat resolves GaN into Ga and $N_2$ gas at the interface between the sapphire substrate 10 and the GaN buffer layer 24. As a result, the sapphire substrate 10 is separated from the semiconductor layer 20.

At this time, the local heat may be released through the grooves 11 while resolving GaN into Ga and $N_2$ gas. Also, the $N_2$ gas is also released through the grooves 11 without damaging the semiconductor layer 20.

Figure 18:
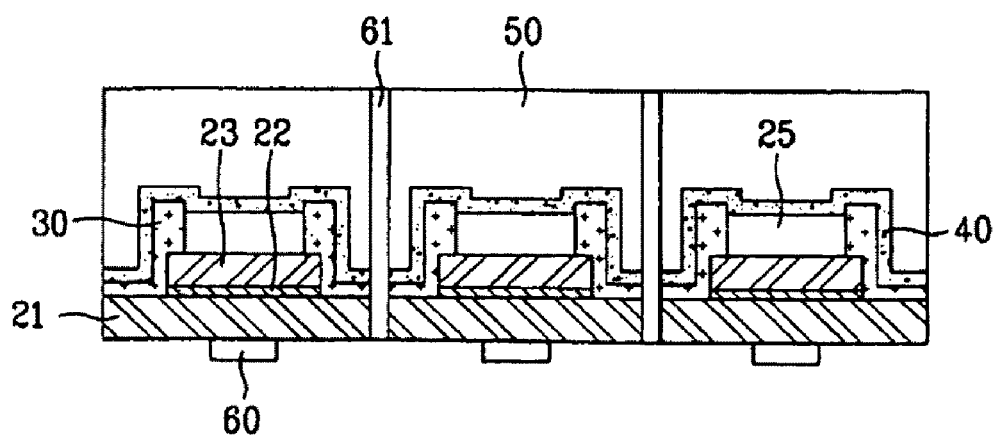

After the removal of the substrate 10 using the LLO process as described above, a plurality of n type electrodes 60 are formed on a surface, from which the substrate 10 has been removed, in regions corresponding to respective devices, as shown in FIG. 18.

Each n type electrode 60 may have the form of a metal pad, as shown in FIG. 18.

LED devices are completely formed in accordance with the formation of the n type electrodes 70 as described above. Thereafter, a process for separating the LED devices into individual unit devices is carried out.

The separation of individual devices may be achieved using an expansion tape.

<Third Embodiment>

Hereinafter, a third embodiment of the present invention will be described with reference to FIGS. 19 and 20.

Figure 19:
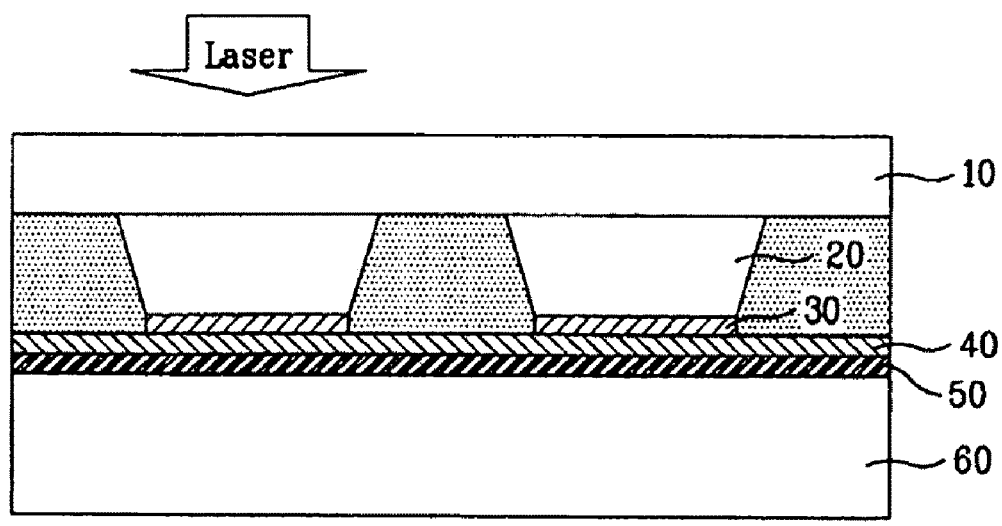
FIG. 19 is a sectional view illustrating a method for manufacturing a light emitting device according to a third embodiment of the present invention.
Figure 20:
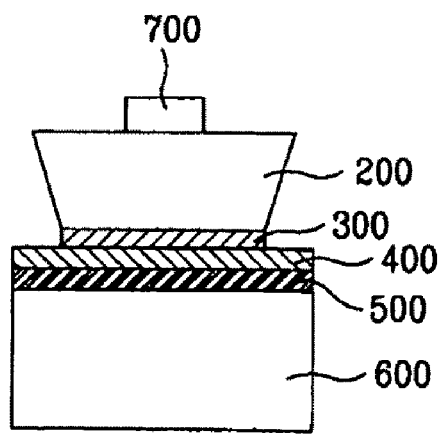
FIG. 20 is a sectional view illustrating the light emitting device according to the third embodiment of the present invention.

As shown in FIG. 19, in order to manufacture a light emitting device according to this embodiment, a process for growing a GaN semiconductor layer 200 having a multilayer structure over a sapphire substrate 100 is first carried out.

The GaN semiconductor layer 200 includes an n type GaN layer formed over the substrate 100, an active layer formed over the n type GaN layer, and a p type GaN layer formed over the active layer. A separate buffer layer may be formed between the n type GaN layer and the substrate 100.

Alternatively, a p type GaN layer may be formed over the substrate 100, and an active layer and an n type GaN layer may be sequentially formed over the p type GaN layer.

The active layer may have a GaN-based single quantum well (SQW) structure, a GaN-based multi-quantum well (MQW) structure, or a quantum structure, for example, a supper lattice of the GaN-based SQW or MQW structure.

The quantum structure of the active layer may be formed using a combination of various GaN-based materials. For example, AlInGaN, InGaN, etc. may be used.

The semiconductor layer 200 may be divided into portions respectively corresponding to unit device regions, through an etching process.

In the etching process, a trench is formed between the portions of the semiconductor layer 200 corresponding to adjacent unit device regions. Thus, this etching process is called a "trench etching process". This etching is carried out until the substrate 100 is exposed.

Thereafter, first electrodes 300 are formed on the GaN semiconductor layer 200. Also, a material such as an epoxy resin, which can be easily removed, is filled in spaces formed in accordance with the above-described etching process.

Each first electrode 300 may include an ohmic electrode and a reflection electrode. For the ohmic electrode, a transparent electrode is used. In this case, the transparent electrode may be made of an appropriate material such as ruthenium/gold (Ru/Au), nickel/gold (Ni/Au), or indium tin oxide (ITO).

Each first electrode 300 may be a p type electrode. Of course, each first electrode 300 may be an n type electrode in accordance with the arrangement of the semiconductor layer 200.

The reflection electrode functions to reflect light emitted from the semiconductor layer 200, in order to effectively diffuse the light. The reflection electrode is made of silver (Ag) or aluminum (Al), together with a material exhibiting a high reflectivity.

In order to effectively bond, to the first electrodes 300, metal layers 500 and 600, which will be subsequently laminated over the first electrodes 300, a seed metal layer 400 is laminated over the first electrodes 300.

The seed metal layer 400 may be made of one of titanium (Ti), platinum (Pt), gold (Au), nickel (Ni), aluminum (Al), and an alloy thereof.

An impact damping layer 500 is then formed over the seed metal layer 400. The impact damping layer 500 is made of a metal exhibiting a ductility higher than the metal of the metal support 600.

The metal support 600 is then formed over the impact damping layer 500. The metal support 600 may be formed in accordance with an electro plating process, using a metal such as Cu, Ni, or Au.

Since the impact damping layer 500 exhibits a ductility higher than that of the metal of the metal support 600, it can effectively absorb impact generated during an LLO process. Accordingly, it is possible to prevent the semiconductor layer 200 from being influenced by the impact, or to avoid damage of the bonding between the metal layers.

The impact damping layer 500 may be made of a metal such as In, Sn, Ag, Au, Pt, or Al, or an alloy thereof. Preferably, the thickness of the impact damping layer 500 is about 1 to 10 μm.

After a desired light emitting device structure is completely formed, as described above, separation of the substrate 100 is carried out using a general LLO process.

In this case, thermal stress generated during the LLO process and impact caused by introduction of nitrogen gas ($N_2$) during the LLO process are absorbed by the impact damping layer 500.

Accordingly, it is possible to prevent impact generated during the LLO process from being applied to bonding areas among the first electrode 300, seed metal layer 400, and metal support 600, and thus, to prevent the bonding areas from being damaged. It is also possible to prevent the impact from being transferred to the semiconductor layer 200.

After the separation of the substrate 100 as described above, second electrodes 700 are formed on a surface of the semiconductor layer 200 from which the substrate 100 has been separated. Thereafter, the light emitting device structure is separated into individual unit devices, as shown in FIG. 20.

Each second electrode 700 may be an n type electrode. Of course, each second electrode 700 may be a p type electrode in accordance with the arrangement of the semiconductor layer 200.

<Fourth Embodiment>

Hereinafter, a fourth embodiment of the present invention will be described with reference to FIGS. 21 and 22.

Figure 21:
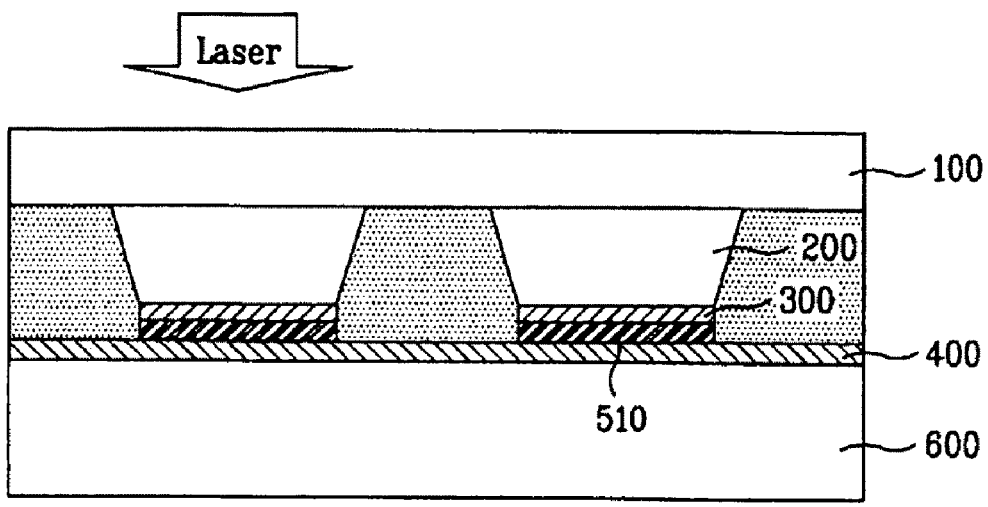
FIG. 21 is a sectional view illustrating a method for manufacturing a light emitting device according to a fourth embodiment of the present invention.
Figure 22:
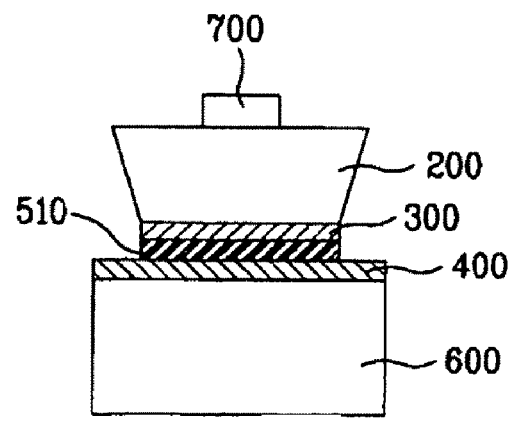
FIG. 22 is a sectional view illustrating the light emitting device according to the fourth embodiment of the present invention.

As shown in FIG. 21, in order to manufacture a light emitting device according to this embodiment, a semiconductor layer 200 having a multilayer structure is formed over a substrate 100, and first electrodes 300 are then formed on the semiconductor layer 200. An impact damping layer 510 is then formed over each first electrode layer 300. The impact damping layer 510 may have the same width as the first electrode 300.

A seed metal layer 400 is formed over the impact damping layer 510. A metal support 600 is then formed over the seed metal layer 400.

The remaining processes in this embodiment are identical to those of the third embodiment. After a desired light emitting device structure is completely formed, separation of the substrate 100 is carried out using a general LLO process. Second electrodes 700 are then formed on a surface of the semiconductor layer 200 from which the substrate 100 has been separated. Thereafter, the light emitting device structure is separated into individual unit devices, as shown in FIG. 22.

<Fifth Embodiment>

Hereinafter, a fifth embodiment of the present invention will be described with reference to FIGS. 23 and 24.

Figure 23:
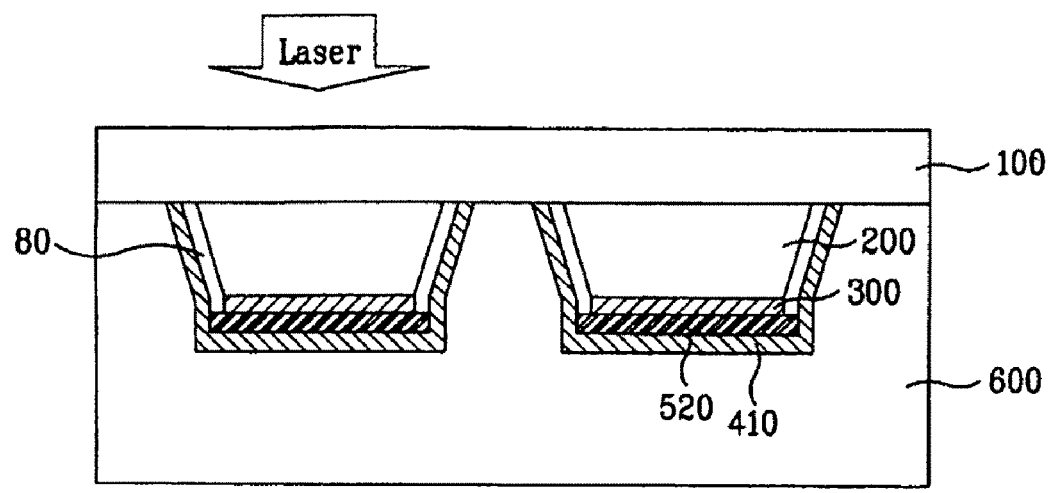
FIG. 23 is a sectional view illustrating a method for manufacturing a light emitting device according to a fifth embodiment of the present invention.
Figure 24:
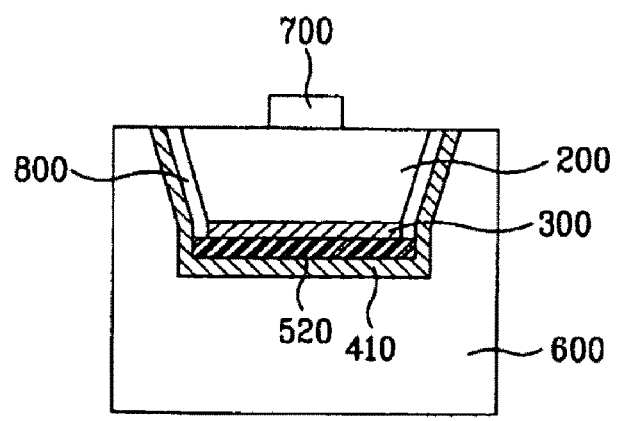
FIG. 24 is a sectional view illustrating the light emitting device according to the fifth embodiment of the present invention.

As shown in FIG. 23, a semiconductor layer 200 is first formed over a substrate 100. The semiconductor layer 200 is then etched, in order to define unit device regions. First electrodes 300 are then formed on the semiconductor layer 200.

Thereafter, a passivation layer 800 is formed around portions of the semiconductor layer 200 exposed in accordance with the etching process, as shown in FIG. 23.

An impact damping layer 520 is then formed over each first electrode 300. Subsequently, a seed metal layer 410 is formed to cover the impact damping layer 520 and passivation layer 800.

The passivation layer 800 is made of a dielectric material. The passivation layer 800 functions to protect the semiconductor layer 200, and to insulate the semiconductor layer 200 from the seed metal layer 410 formed around the semiconductor layer 200.

Thereafter, a metal support 600 is formed to cover the seed metal layer 410. The resulting structure is shown in FIG. 23.

The metal support 600 completely fills the space defined between the adjacent portions of the semiconductor layer 200. In this case, posts (not shown) may be formed in trench-etched regions, using a material such as photoresist, before the formation of the metal support 600. Accordingly, it is possible to easily separate, into individual devices, the light emitting device structure obtained after separation of the substrate 100.

Thereafter, the light emitting device structure is separated into individual unit devices, and second electrodes 700 are formed. Thus, the individual unit devices as shown in FIG. 24 is completely formed.

<Sixth Embodiment>

Hereinafter, a sixth embodiment of the present invention will be described with reference to FIGS. 25 and 26.

Figure 25:
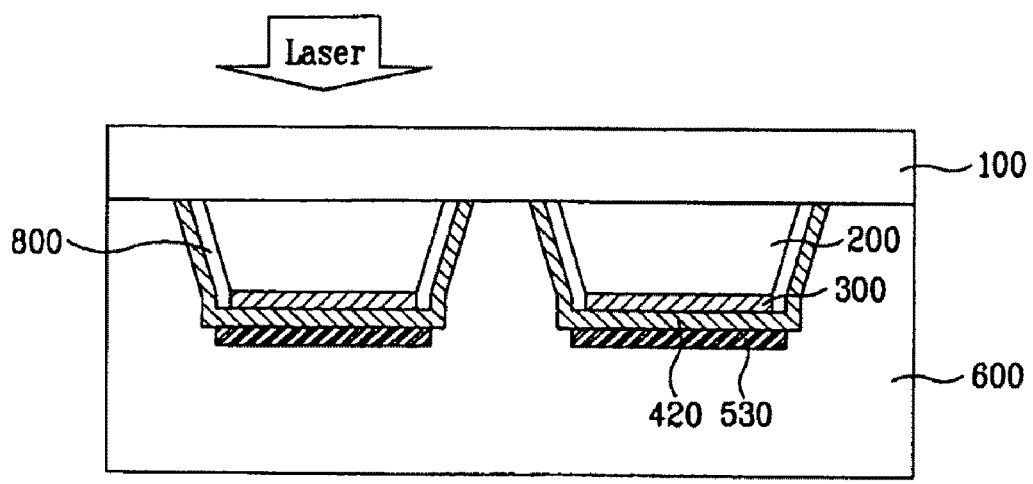
FIG. 25 is a sectional view illustrating a method for manufacturing a light emitting device according to a sixth embodiment of the present invention.
Figure 26:
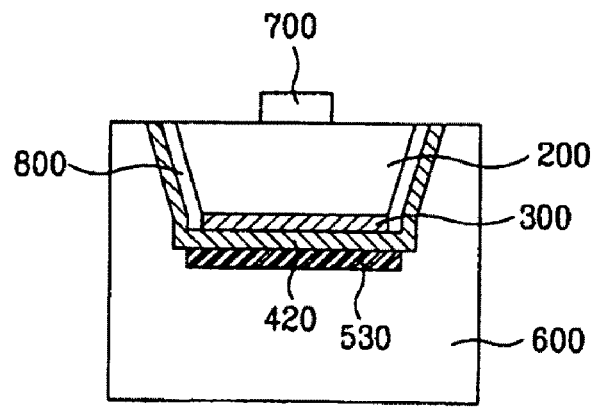
FIG. 26 is a sectional view illustrating the light emitting device according to the sixth embodiment of the present invention.

As shown in FIG. 25, a semiconductor layer 200 is first formed over a substrate 100. The semiconductor layer 200 is then etched, in order to define unit device regions. First electrodes 300 are then formed on the semiconductor layer 200. A passivation layer 800 is subsequently formed around portions of the semiconductor layer 200 exposed in accordance with the etching process, as shown in FIG. 25.

A seed metal layer 420 is then formed to cover the first electrodes 300 and passivation layer 800.

An impact damping layer 530 is then formed on the seed metal layer 420. Subsequently, a metal support 600 is formed on the impact damping layer 530. The impact damping layer 530 is interposed between the seed metal layer 420 and the metal support 600. The remaining structure is identical to that of the fifth embodiment.

A LLO process is then carried out in the same manner as described above, in order to separate the substrate 100. Subsequently, second electrodes 700 are formed on a surface from which the substrate 100 is separated. Thereafter, the light emitting device structure is separated into individual unit devices as shown in FIG. 24.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device having a vertical structure, comprising:
    a conductive support structure comprising a support layer;
    a bonding layer on the conductive support structure;
    a first electrode on the bonding layer, the first electrode comprising a reflective electrode;
    a metal layer arranged between the first electrode and the bonding layer, wherein the ductility of the metal layer is higher than the ductility of the support layer, and wherein a width of the metal layer is greater than a width of the first electrode;
    a semiconductor structure having multi-layers on the first electrode, the semiconductor structure having an inclined side surface, wherein the semiconductor structure comprises a first-type semiconductor layer on the first electrode, an active layer on the first-type semiconductor layer, and a second-type semiconductor layer on the active layer;
    a passivation layer on the semiconductor structure, wherein the passivation layer contacts the metal layer; and
    a second electrode on the semiconductor structure.

2. The light emitting device according to claim 1, wherein the bonding layer is configured to enhance an adhesion between the conductive support structure and the metal layer.

3. The light emitting device according to claim 1, wherein the surface area of the first electrode facing the semiconductor structure is smaller than the surface area of the conductive support structure facing the bonding layer.

4. The light emitting device according to claim 1, wherein the surface area of the semiconductor structure facing the first electrode is smaller than the surface area of the conductive support structure facing the bonding layer.

5. The light emitting device according to claim 1, wherein the metal layer includes at least one of In, Sn, Ag, Au, Pt and Al.

6. The light emitting device according to claim 1, wherein the metal layer has a thickness of 1 to 10 µm.

7. The light emitting device according to claim 1, wherein the semiconductor structure comprises a GaN-based semiconductor layer.

8. The light emitting device according to claim 1, wherein the support layer includes at least one of Cu, Ni and Au.

9. The light emitting device according to claim 1, wherein the conductive support structure has a thickness of 30 to 200 µm.

10. The light emitting device according to claim 1, wherein the reflective electrode comprises at least one of Ag and Al.

11. The light emitting device according to claim 1, wherein the bonding layer comprises at least one of Ti, Pt, Au, Ni and Al.

12. The light emitting device according to claim 1, wherein the first electrode and the metal layer have surfaces facing each other, and wherein the areas of the surfaces are substantially the same.

13. The light emitting device according to claim 1, wherein the first electrode contacts the metal layer.

14. The light emitting device according to claim 1, wherein the metal layer contacts the bonding layer.

15. The light emitting device according to claim 1, wherein the passivation layer is on the side surface of the semiconductor structure.

16. The light emitting device according to claim 1, wherein the passivation layer contacts the bonding layer.

17. The light emitting device according to claim 1, wherein the first-type is p-type and the second-type is n-type.

18. The light-emitting device according to claim 1, wherein the passivation layer contacts an edge portion of the metal layer.

19. The light emitting device according to claim 1, wherein the metal layer is configured to absorb impact that occurs during manufacturing process.

20. The light emitting device according to claim 1, wherein the first electrode comprises an ohmic electrode.

21. The light emitting device according to claim 20, wherein the ohmic electrode comprises transparent material.

22. The light emitting device according to claim 20, wherein the ohmic electrode comprises at least one of Ru, Ni, Au and ITO.

23. The light emitting device according to claim 20, wherein the ohmic electrode contacts the semiconductor structure.

24. The light emitting device according to claim 1, wherein the inclination of the the inclined side surface is a substantially fixed inclination.

* * * * *